United States Patent [19]
Voshell

[11] Patent Number: 5,923,594
[45] Date of Patent: Jul. 13, 1999

[54] METHOD AND APPARATUS FOR COUPLING DATA FROM A MEMORY DEVICE USING A SINGLE ENDED READ DATA PATH

[75] Inventor: Thomas W. Voshell, Boise, Id.

[73] Assignee: Micron Technology, Inc., Boise, Id.

[21] Appl. No.: 09/024,367

[22] Filed: Feb. 17, 1998

[51] Int. Cl.[6] .................................................. G11C 7/00
[52] U.S. Cl. .............................. 365/189.05; 365/189.02; 365/190
[58] Field of Search .............................. 365/189.05, 205, 365/207, 208, 190, 189.02

[56] References Cited

U.S. PATENT DOCUMENTS

| | | | |
|---|---|---|---|
| 4,096,402 | 6/1978 | Schroeder et al. | 307/362 |
| 4,404,474 | 9/1983 | Dingwall | 307/260 |
| 4,611,337 | 9/1986 | Evans | 377/123 |
| 4,638,187 | 1/1987 | Boler et al. | 307/451 |
| 4,789,796 | 12/1988 | Foss | 307/443 |
| 4,958,088 | 9/1990 | Farah-Bakhsh et al. | 307/443 |
| 4,984,204 | 1/1991 | Sato et al. | 365/189.11 |
| 5,111,435 | 5/1992 | Miyamoto | 365/230.06 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,254,883 | 10/1993 | Horowitz et al. | 307/443 |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,311,481 | 5/1994 | Casper et al. | 365/230.06 |
| 5,321,368 | 6/1994 | Hoelzle | 328/63 |
| 5,347,177 | 9/1994 | Lipp | 307/443 |

(List continued on next page.)

FOREIGN PATENT DOCUMENTS

| | | |
|---|---|---|
| 0 450 871 A2 | 10/1991 | European Pat. Off. . |
| 0 655 741 A2 | 5/1995 | European Pat. Off. . |
| 0 680 049 A2 | 11/1995 | European Pat. Off. . |
| 0 692 872 A2 | 1/1996 | European Pat. Off. . |
| 2-112317 | 4/1990 | Japan . |
| 4-135311 | 8/1992 | Japan . |
| 5-136664 | 1/1993 | Japan . |
| 5-282868 | 10/1993 | Japan . |

OTHER PUBLICATIONS

Taguchi, M. et al., "A 40–ns64–Mb DRAM with 64–b Parallel Data Bus Architecture", IEEE Journal of Solid–State Circuits, vol. 26, Nov. 1991, pp. 1493–1497.

*Primary Examiner*—Son Mai
*Attorney, Agent, or Firm*—Seed and Berry LLP

[57] ABSTRACT

A single ended read data path in a memory device is described for providing a data signal from a cell in a memory array to a data output terminal. A single conductive path couples the data signal between a DC sense amplifier and a data output circuit in the memory device.

6 Claims, 6 Drawing Sheets

U.S. PATENT DOCUMENTS

| | | |
|---|---|---|
| 5,347,179 | 9/1994 | Casper et al. .......................... 307/451 |
| 5,361,002 | 11/1994 | Casper ................................... 327/530 |
| 5,390,308 | 2/1995 | Ware et al. ............................ 395/400 |
| 5,400,283 | 3/1995 | Raad ..................................... 365/203 |
| 5,438,545 | 8/1995 | Sim ................................... 365/189.05 |
| 5,440,260 | 8/1995 | Hayashi et al. ....................... 327/278 |
| 5,457,407 | 10/1995 | Shu et al. ................................ 326/30 |
| 5,473,575 | 12/1995 | Farmwald et al. ............... 365/230.06 |
| 5,475,642 | 12/1995 | Taylor .................................. 365/203 |
| 5,497,127 | 3/1996 | Sauer ...................................... 331/17 |
| 5,498,990 | 3/1996 | Leung et al. ........................... 327/323 |
| 5,506,814 | 4/1996 | Hush et al. ....................... 365/230.03 |
| 5,508,638 | 4/1996 | Cowles et al. ........................... 326/38 |
| 5,513,327 | 4/1996 | Farmwald et al. .................... 395/309 |
| 5,568,077 | 10/1996 | Sato et al. ............................. 327/199 |
| 5,574,698 | 11/1996 | Raad ................................ 365/230.06 |
| 5,576,645 | 11/1996 | Farwell ................................... 327/94 |
| 5,578,941 | 11/1996 | Sher et al. ............................... 326/34 |
| 5,581,197 | 12/1996 | Motley et al. ........................... 326/30 |
| 5,590,073 | 12/1996 | Arakawa et al. ................. 365/185.08 |
| 5,619,473 | 4/1997 | Hotta .................................. 365/238.5 |
| 5,621,690 | 4/1997 | Jungroth et al. ...................... 365/200 |
| 5,627,780 | 5/1997 | Malhi ............................... 365/185.09 |
| 5,627,791 | 5/1997 | Wright et al. ......................... 365/222 |
| 5,631,872 | 5/1997 | Naritake et al. ...................... 365/227 |
| 5,636,163 | 6/1997 | Furutani et al. .................. 365/189.01 |
| 5,636,173 | 6/1997 | Schaefer ........................... 365/230.03 |
| 5,636,174 | 6/1997 | Rao .................................. 365/230.03 |
| 5,638,335 | 6/1997 | Akiyama et al. ................. 365/230.03 |
| 5,655,105 | 8/1997 | McLaury ............................... 395/496 |
| 5,668,763 | 9/1997 | Fujioka et al. ......................... 365/200 |
| 5,694,065 | 12/1997 | Hamasaki et al. .................... 327/108 |
| 5,737,276 | 4/1998 | Shin ................................. 365/230.08 |
| 5,831,929 | 11/1998 | Manning .............................. 365/233 |

OTHER PUBLICATIONS

Descriptive literature entitled, "400 MHz SLDRAM, 4M×16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1–56.

METHOD AND APPARATUS FOR COUPLING DATA FROM A MEMORY DEVICE USING A SINGLE ENDED READ DATA PATH

TECHNICAL FIELD

The invention relates generally to integrated circuit memory devices, and more particularly, to a read data path in a memory device.

BACKGROUND OF THE INVENTION

Modern integrated circuit memory devices are comprised of a large number of components and conductive connections arranged on a surface of a silicon chip. The capacity of a memory device to store data is governed by the number of components which may be arranged on the silicon chip. The number of components is limited by the physical size or area of the surface of the silicon chip and the density of the components is limited by parasitic electrical effects which occur between proximate components. It is therefore desirable to minimize the number of components of the memory device to maximize the capacity of the memory device to store data.

A conventional memory device is illustrated in FIG. 1. The memory device is a synchronous dynamic random access memory ("SDRAM") 10 which includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address. The row address multiplexer 18 also couples row addresses to the row address latches 26 for the purpose of refreshing the memory cells in the arrays 20 and 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers and associated column circuits 50 and 52 for the respective arrays 20 and 22.

Data to be read from one of the arrays 20 or 22 are coupled from the arrays 20 or 22, respectively, to a data bus 58 through the column circuit 50 or 52, respectively, and a read data path that includes a data output register 56. Data to be written to one of the arrays 20 or 22 are coupled from the data bus 58 through a write data path, including a data input register 60, to one of the column circuits 50 or 52 where they are transferred to one of the arrays 20 or 22, respectively. A mask register 64 may be used to selectively alter the flow of data into and out of the column circuits 50 and 52 by, for example, selectively masking data to be read from the arrays 20 and 22.

The above-described operation of the SDRAM 10 is controlled by a command decoder 68 responsive to high level command signals received on a control bus 70. These high level command signals, which are typically generated by the memory controller, are a clock enable signal CKE*, a clock signal CLK, a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

As mentioned above, read data are coupled from one of the arrays 20 and 22 to the data bus 58 through a read data path that is shown in greater detail in FIG. 2. The read data path 80 is subsumed in the column circuits 50 and 52 and the data output register 56 shown in FIG. 1.

The read data path 80 begins in one of the columns in the array 20. The column includes a complementary pair of digit lines 84 and 86 coupled to the memory cells in the column. A sense amplifier 88 connected between the digit lines 84 and 86 amplifies a differential data signal on the digit lines 84 and 86 in a well-known manner. The differential data signal indicates the presence of a "1" or a "0" in an enabled memory cell in the column. The digit lines 84 and 86 are selectively coupled to a complementary pair of I/O lines 90 and 92 by well known column addressing circuitry, which is not shown in FIG. 2 for purposes of brevity. The I/O lines 90 and 92 are also selectively coupled to the digit lines for a large number of other columns, but these other digit lines have been omitted for purposes of clarity.

The I/O lines 90 and 92 are selectively coupled to a complementary pair of data lines 94 and 96 by first and second pass gates 98 and 100. The pass gates 98 and 100 are located in a multiplexer (not shown) that selectively couples the pair of data lines 94 and 96 to at least one other complementary pair of I/O lines (not shown). A conductive state of each of the pass gates 98 and 100 is controlled by a bank address signal derived from the bank address bit, which is applied to a control line 102 for the pass gate 98 and to a control line 104 for the pass gate 100. Each of the pass gates 98 and 100 receives the bank address signal at a first terminal, and an inverted bank address signal at a second terminal, which is received from one of two inverters 106 and 108, respectively. When the pass gates 98 and 100 are rendered conductive, the differential data signal is coupled from the digit lines 84 and 86 through the I/O lines 90 and 92 to the data lines 94 and 96.

The data lines 94 and 96 are coupled, respectively, to complementary inputs of a DC sense amplifier 110. The DC sense amplifier 110 is a high speed, high gain differential amplifier that amplifies the differential data signal on the data lines 94 and 96 to full CMOS voltage levels. An amplified differential data signal is generated by the DC sense amplifier 110 at complementary outputs and provided to a complementary pair of primary data path lines 112 and 114. The primary data path lines 112 and 114 provide the amplified differential data signal to a complementary pair of inputs of a multiplexer 116. The multiplexer 116 receives amplified differential data signals from other DC sense amplifiers through alternate primary data path lines 118 and 120 and provides a selected amplified differential data signal from complementary outputs to a complementary pair of secondary data path lines 122 and 124. The secondary data path lines 122 and 124 are connected to a complementary pair of inputs in a data output buffer 126, which provides a data signal to a data bus terminal 128 based on the amplified differential data signal.

The components required to support a single array in a memory device, as shown in FIGS. 1 and 2, are numerous and occupy a substantial amount of a silicon chip. It is therefore advantageous to reduce the number of these components required for each array and thereby increase the capacity of the memory device to store data.

SUMMARY OF THE INVENTION

In accordance with the present invention, a method and apparatus for coupling data from a memory device using a single ended read data path is provided. The memory device includes an array of memory cells arranged in rows and columns, each column having a complementary pair of digit lines, a sense amplifier coupled to the pair of digit lines, and at least one complementary pair of data lines coupled respectively to a selected one of the pairs of digit lines. The memory device also includes a DC sense amplifier having a complementary pair of inputs coupled to the pair of data lines and an output. The DC sense amplifier is structured to generate an amplified signal at the output based on a differential data signal received from the pair of digit lines via the pair of data lines. A data output circuit has an input coupled to the output of the DC sense amplifier by a single conductive path to receive the amplified signal. The data output circuit is structured to provide a data signal to a data output terminal based on the amplified signal. In one embodiment, the digit lines are coupled to the data lines through a pair of pass gates. In another embodiment, a complementary pair of I/O lines is coupled, respectively, between the digit lines and the pass gates. In another embodiment, the DC sense amplifier is a differential amplifier having a second output coupled to a capacitor and is structured to receive the differential data signal and generate an amplified differential data signal from the first and second outputs. The memory device may also include a multiplexer coupled between the DC sense amplifier and the data output circuit coupled to receive amplified signals from several DC sense amplifiers and being structured to select an appropriate amplified signal to be transmitted to the data output circuit.

DETAILED DESCRIPTION OF THE INVENTION

Figure 2:
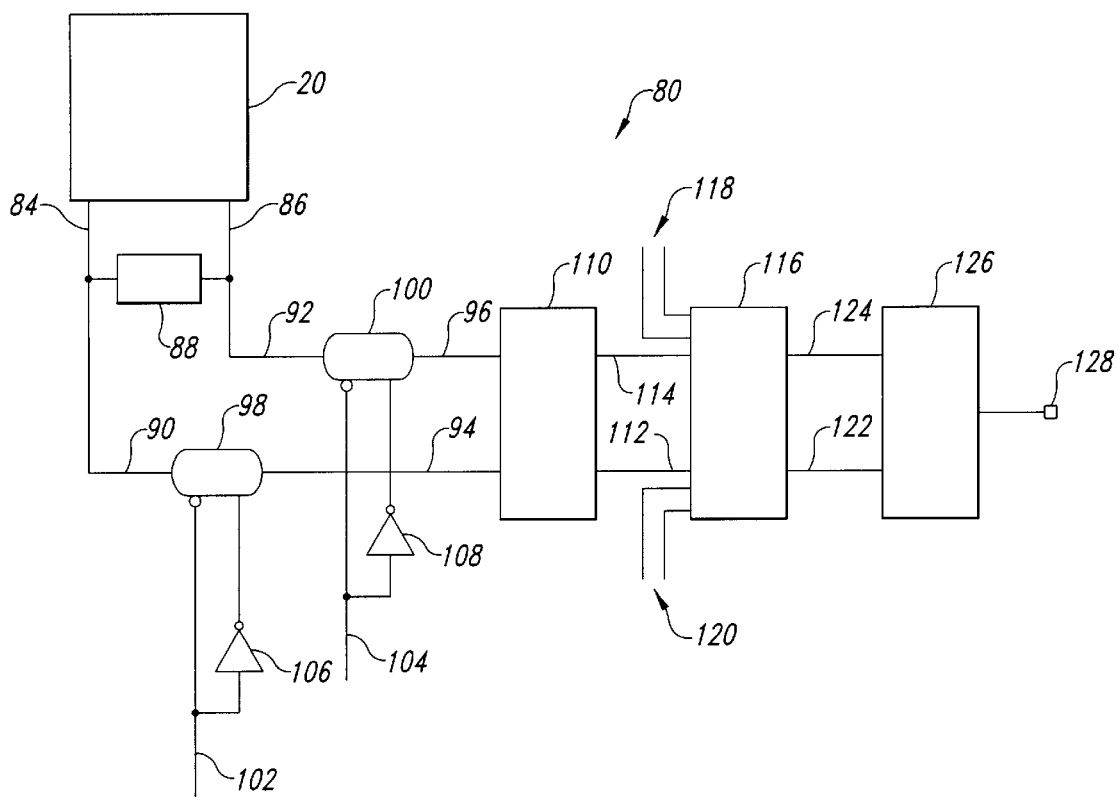
FIG. 2 is a block diagram of a differential read data path according to the prior art.
Figure 3:
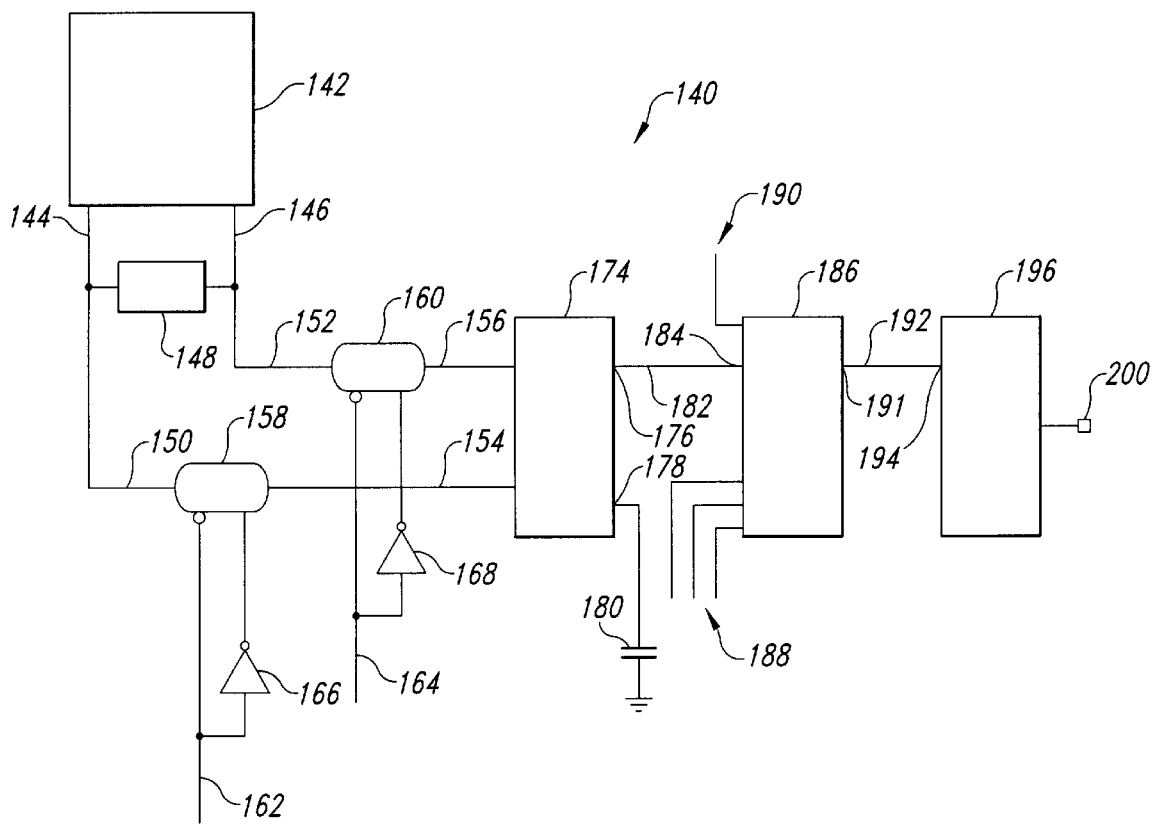
FIG. 3 is a block diagram of a single ended read data path according to one embodiment of the present invention.

A single ended read data path 140 according to one embodiment of the invention is shown in FIG. 3. The single ended read data path 140 like the read data path 80 of FIG. 2, includes a memory bank array 142, a complementary pair of digit lines 144 and 146, a sense amplifier 148 connected between the digit lines 144 and 146, a complementary pair of I/O lines 150 and 152 coupled to the digit lines 144 and 146 and a complementary pair of data lines 154 and 156 coupled to the I/O lines 150 and 152 by pass gates 158 and 160. The pass gates 158 and 160 are located in a multiplexer (not shown). A DC sense amplifier 174 includes input terminals coupled to the data lines 154 and 156. These components are identical to the corresponding components in the read data path 80 of FIG. 2 and an explanation of their operation will not be repeated in the interest of brevity.

The read data path 140 begins to deviate from the read data path 80 at the DC sense amplifier 174. More specifically, although the DC sense amplifier 174 includes a first complementary output 176 and a second complementary output 178, the second complementary output 178 is preferably connected to a ground voltage reference through a capacitor 180. A single, primary data path line 182 is connected between the first complementary output 176 of the DC sense amplifier 174 and an input 184 of a multiplexer 186. The multiplexer 186 receives signals from other DC sense amplifiers through alternate primary data path lines 188 and 190. The multiplexer 186 has a single output 191 which is connected by a single, secondary data path line 192 to an input 194 of a data output buffer 196. The data output buffer 196 has an output 198 connected to a data bus terminal 200.

The capacitor 180 is preferably selected to be approximately equivalent to the line capacitance of the primary data path line 182 in order to provide a voltage balance between the first and second complementary outputs 176 and 178 of the DC sense amplifier 174.

The single ended read data path 140 provides the advantage of having a single primary data path line 182 carrying data from the memory cell between the DC sense amplifier 174 and the multiplexer 186, and a single secondary data path line 192 carrying the data between the multiplexer 186 and the data output buffer 196. The single ended read data path 140 eliminates a complementary primary data path line between the DC sense amplifier 174 and the multiplexer 186, and a complementary secondary data path line between the multiplexer 186 and the data output buffer 196, thereby reducing the number of conductive connections, which reduces the amount of silicon necessary to support a memory device with the single ended read data path 140. The elimination of conductive paths may also reduce the amount of power consumed by the memory device.

Figure 1:
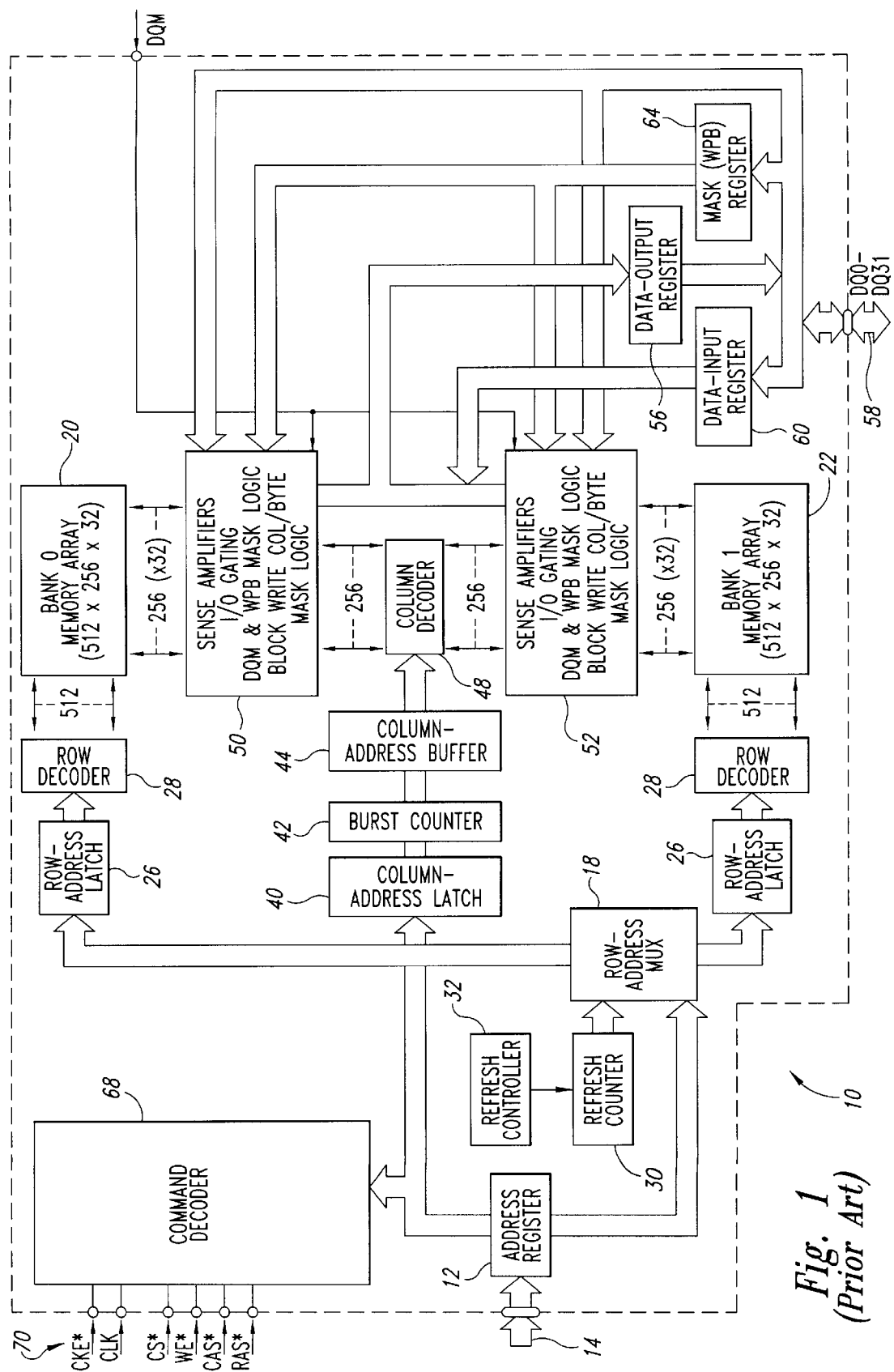
FIG. 1 is a block diagram of a memory device according to the prior art.
Figure 4:
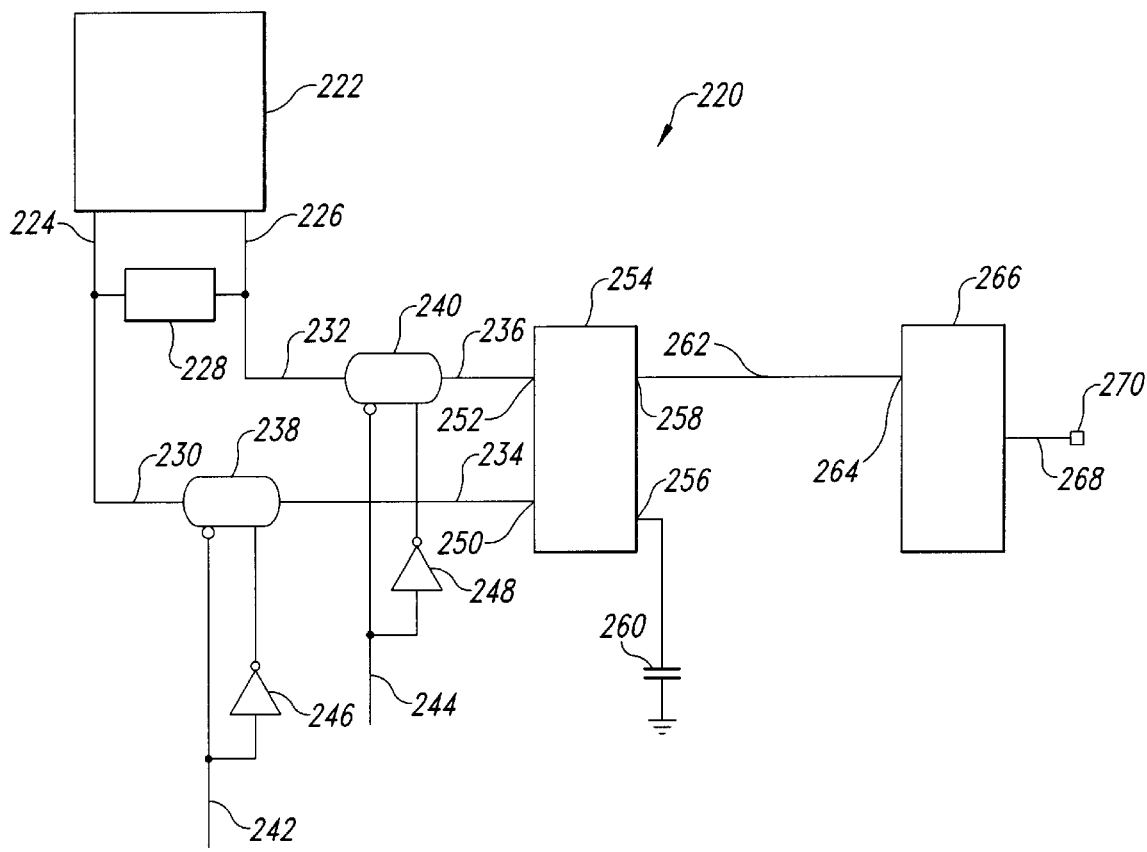
FIG. 4 is a block diagram of a single ended read data path without a multiplexer according to another embodiment of the present invention.

A single ended read data path 220 according to another embodiment of the invention is shown in FIG. 4. The single ended read data path 220 begins in a column in a memory bank array 222 that is coupled through a pair of digit lines 224 and 226 to a sense amplifier 228 as explained above with reference to FIGS. 1–3. As further explained above, the digit lines 224 and 226 are selectively coupled to a complementary pair of I/O lines 230 and 232, and the I/O lines 230 and 232 are selectively coupled to a complementary pair of data lines 234 and 236 by two pass gates 238 and 240. The pass gates 238 and 240 are controlled by a bank address signal applied to respective control lines 242 and 244 directly and through respective inverters 246 and 248. As before, when the pass gates 238 and 240 are rendered conductive, a differential data signal is coupled from the digit lines 224 and 226 through the I/O lines 230 and 232 to the data lines 234 and 236. As in the embodiment of FIG. 3, the data lines 234 and 236 are coupled, respectively, to a first complementary input 250 and a second complementary input 252 of a DC sense amplifier 254. A first differential output 256 of the DC sense amplifier 254 is coupled to a capacitor 260.

The embodiment of FIG. 4 differs from the embodiment of FIG. 3 by omitting the multiplexer 186 of FIG. 3. Instead, a single data path line 262 is connected between a second complementary output 258 of the DC sense amplifier 254 and an input 264 of a data output buffer 266. The data output buffer 266 has an output 268 connected to a data bus terminal 270.

Figure 5:
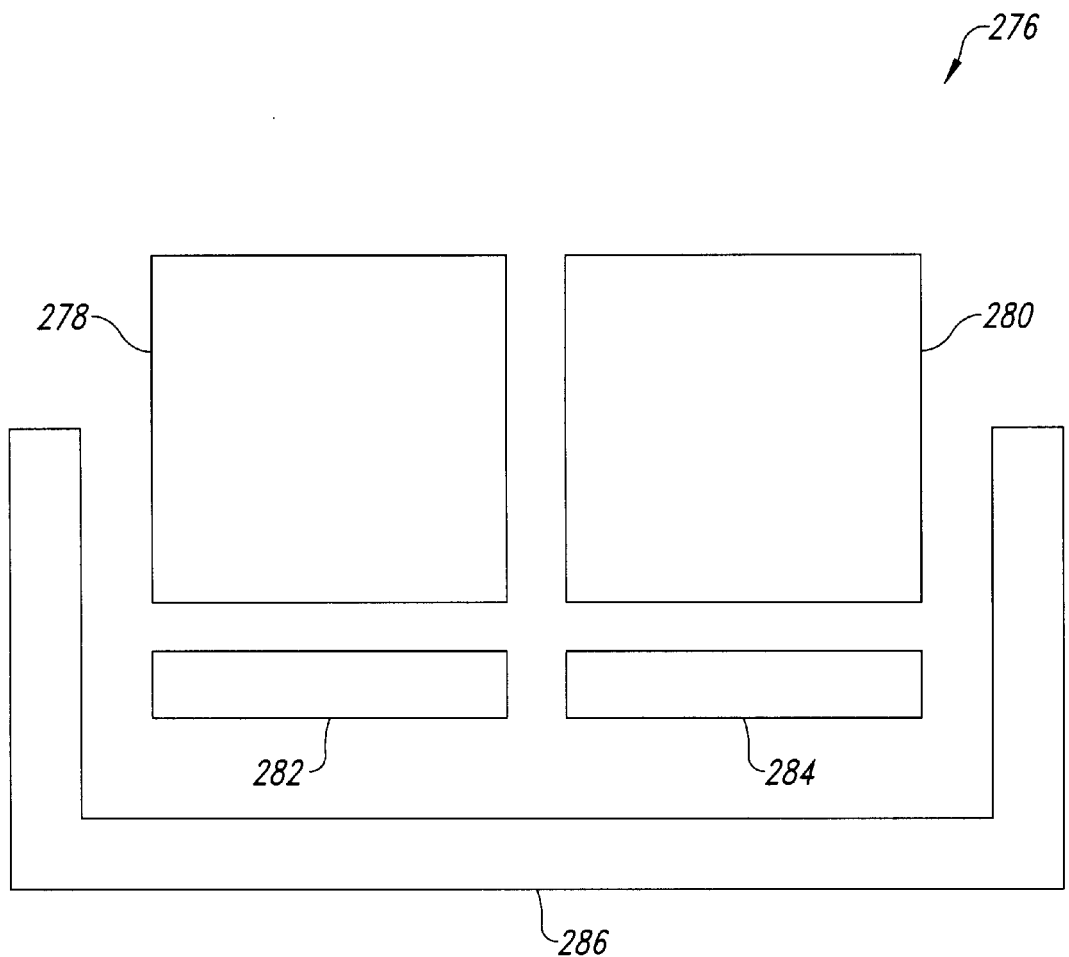
FIG. 5 is a block diagram of elements of a memory device including the single ended read data path of FIG. 3 showing approximate distances between the elements on a surface of a semiconductor chip.

FIG. 5 is a block diagram of several elements of an SDRAM 276 as they are arranged on a surface of a semiconductor chip according to another embodiment of the invention. The SDRAM 276 includes a single ended read data path similar to the one shown in FIG. 3. The blocks in FIG. 5 are shown spaced to indicate relative distances between elements of the SDRAM 276 on the surface of the semiconductor chip.

Two memory bank arrays 278 and 280 are located in a center of the semiconductor chip. The arrays 278 and 280 are comprised of memory cells arranged in rows and columns. Each of the arrays 278 and 280 includes a respective set of pairs of digit lines for each column, a sense amplifier coupled to each pair of digit lines, and a set of multiplexers located near the bottom of each of the arrays 278 and 280. Each of the arrays 278 and 280 is coupled to a respective data path circuit 282 and 284 through a plurality of respective data lines which are not shown for purposes of clarity. The data path circuits 282 and 284 contain respective DC sense amplifiers coupled to receive the data lines and respective multiplexers coupled to receive a single data path line for every pair of data lines received by the DC sense amplifiers. An output circuit 286 includes a plurality of data output buffers and data bus terminals, which are structured to be coupled to a data bus. The data bus terminals in the output circuit 286 are arranged in a horseshoe pattern around the sides and bottom of the semiconductor chip containing the SDRAM 276.

Each multiplexer in the data path circuits 282 and 284 is connected to a respective data output buffer in the output circuit 286 through a single data path line. The data path lines are not shown for purposes of clarity. The data path circuits 282 and 284 are located closer to the arrays 278 and 280 than to the output circuit 286.

Other logic circuitry in the SDRAM 276 such as row address and column address circuitry, read/write control circuitry, and associated multiplexers are arranged on the surface of the semiconductor chip between the arrays 278 and 280 and the output circuit 286 in a manner that is also not shown. This additional logic circuitry is embedded between the arrays 278 and 280 and the output circuit 286 in a very dense and intricate fashion. One of the significant advantages of the invention is that the employment of a single data path line between each of the DC sense amplifiers and the multiplexers in the data path circuitry 282 and 284 and respective data output buffers in the output circuit 286 eliminates one-half of the multiplexers and read/write control circuitry that would be necessary to support a fully differential data path between each of the DC sense amplifiers and the data output buffers. As a consequence, mutual parasitic effects between the circuit elements in the SDRAM 276 are reduced and more circuitry may be arranged on a smaller surface area of the semiconductor chip.

Figure 6:
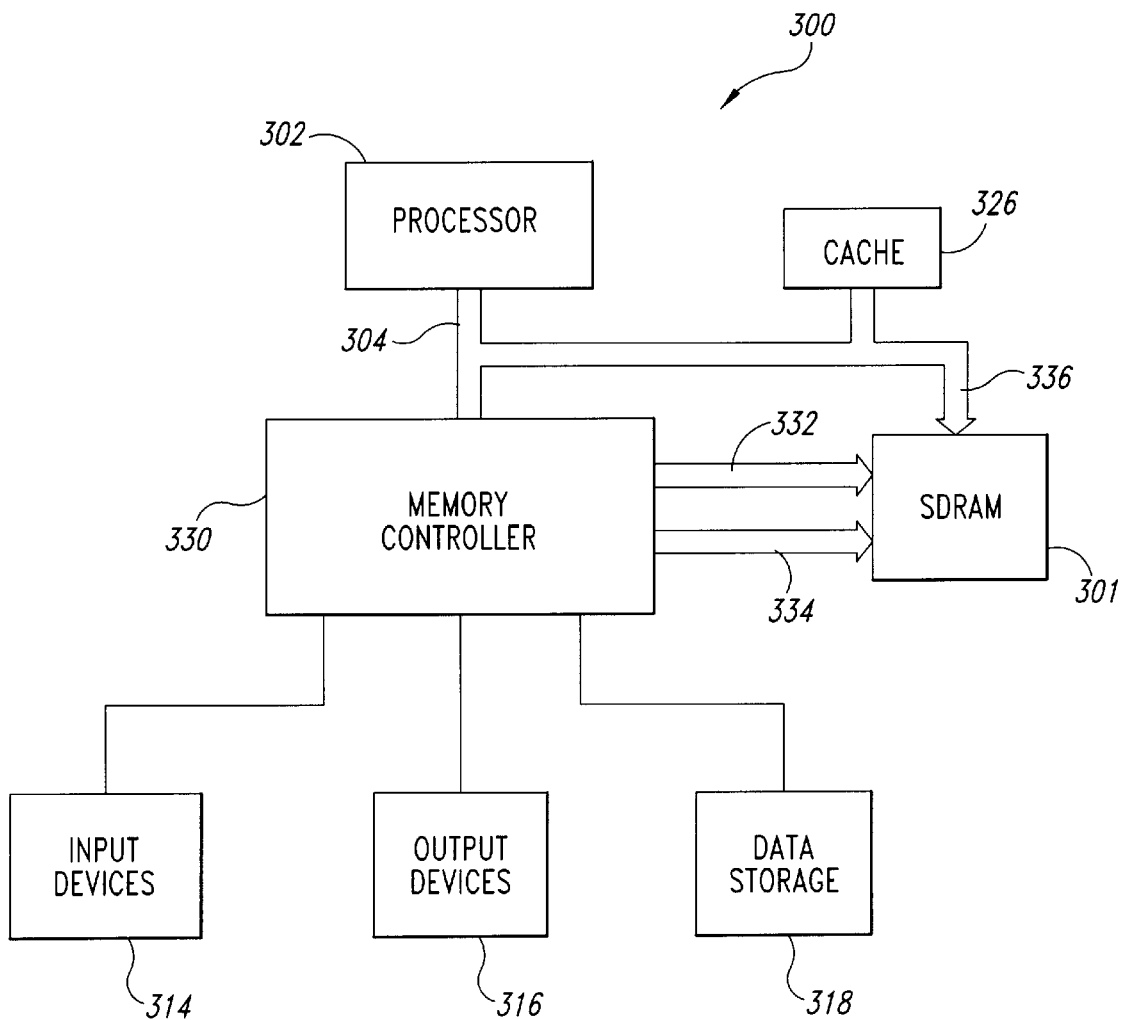
FIG. 6 is a block diagram of a computer system including the single ended read data path of FIG. 3 or FIG. 4.

FIG. 6 is a block diagram of a computer system 300, which includes an SDRAM 301 having a single ended read data path similar to those shown in FIGS. 3 and 4. The computer system 300 includes a processor 302 for performing various computing functions, such as executing specific software to perform specific calculations or tasks. The processor 302 includes a processor bus 304 that includes an address bus, a control bus, and a data bus. In addition, the computer system 300 includes one or more input devices 314, such as a keyboard or a mouse, coupled to the processor 302 to allow an operator to interface with the computer system 300. The computer system 300 also includes one or more output devices 316 coupled to the processor 302, such as a printer or a video terminal. One or more data storage devices 318 may also be coupled to the processor 302 to allow the processor 302 to store data or retrieve data from internal or external storage media (not shown). Examples of typical storage devices 318 include hard and floppy disks, tape cassettes, and compact disk read-only memories (CD-ROMs). The processor 302 is also coupled to a cache memory 326, which is a static random access memory ("SRAM"), and to the SDRAM 301 through a memory controller 330. The memory controller 330 includes a control bus 332 and an address bus 334 which are coupled to the SDRAM 301. A data bus 336 is coupled between the SDRAM 301 and the processor bus 304.

Although the present invention has been described with reference to several embodiments shown in the drawings, the invention is not limited to these embodiments. Rather, the invention is limited only by the appended claims, which include within their scope all equivalent devices or methods which operate according to the principles of the invention as described.

I claim:

1. A memory device having an address bus and a data output terminal comprising:

at least one array of memory cells arranged in rows and columns, each of the rows having a row line and each of the columns having a complementary pair of digit lines;

a sense amplifier for each column, each sense amplifier having a pair of terminals coupled respectively to the digit lines of a respective one of the columns, the sense amplifier being structured to amplify a differential data signal on the digit lines;

at least one complementary pair of data lines, the data lines being coupled respectively to a selected one of the pairs of digit lines to receive the differential data signal from the selected digit lines;

a DC sense amplifier having a complementary pair of inputs, a first output and a second output coupled to a capacitor, each of the pair of inputs of the DC sense amplifier being coupled to a respective one of the data lines to receive the differential data signal from the data lines, the DC sense amplifier being structured to generate an amplified differential signal from the first and second outputs based on the differential data signal received from the data lines; and a data output circuit having an input coupled to the first output of the DC sense amplifier by a single conductive path to receive the amplified signal, the data output circuit being structured to provide a data signal to the data output terminal based on the amplified signal.

2. A memory device having an address bus and a data output terminal comprising:

at least one array of memory cells arranged in rows and columns, each of the rows having a row line and each of the columns having a complementary pair of digit lines;

a sense amplifier for each column, each sense amplifier having a pair of terminals coupled respectively to the digit lines of a respective one of the columns, the sense amplifier being structured to amplify a differential data signal on the digit lines;

at least one complementary pair of data lines, the data lines being coupled respectively to a selected one of the pairs of digit lines to receive the differential data signal from the selected digit lines;

a DC sense amplifier having a complementary pair of inputs and a first output, each of the pair of inputs of the DC sense amplifier being coupled to a respective one of the data lines to receive the differential data signal from the data lines, the DC sense amplifier being structured to generate an amplified signal at the first output based on the differential data signal received from the data lines;

a data output circuit having an input coupled to the first output of the DC sense amplifier by a single conductive path to receive the amplified signal, the data output circuit being structured to provide a data signal to the data output terminal based on the amplified signal;

a multiplexer having an input coupled to the first output of the DC sense amplifier and an output coupled to the input of the data output circuit;

a plurality of complementary pairs of I/O lines;

a row address circuit coupled to the address bus for activating a row line corresponding to a row address coupled to the row address circuit through the address bus; and a column address circuit coupled to the address bus for coupling to a pair of the I/O lines a selected one of the pairs of digit lines for a column corresponding to a column address coupled to the column address circuit through the address bus.

3. A data path adapted for use in a memory device having complementary data lines, the data path comprising:

a DC sense amplifier having a complementary pair of inputs, a first output and a second output coupled to a capacitor, each of the pair of inputs of the DC sense amplifier being coupled to a respective one of the data lines, the DC sense amplifier being structured to generate an amplified differential signal from the first and second outputs based on a differential data signal received from the data lines and a data output circuit having an input coupled to the first output of the DC sense amplifier by a single conductive path to receive the amplified signal, the data output circuit being structured to generate a data signal at a data output terminal based on the amplified signal.

4. A computer system comprising:

a processor having a processor bus;

an input device coupled to the processor through the processor bus and adapted to allow data to be entered into the computer system;

an output device coupled to the processor through the processor bus and adapted to allow data to be output from the computer system; and a memory device coupled to the processor through the processor bus, the memory device comprising:

at least one array of memory cells arranged in rows and columns, each of the rows having a row line and each of the columns having a complementary pair of digit lines;

a sense amplifier for each column, each sense amplifier having a pair of terminals coupled respectively to the digit lines of a respective one of the columns, the sense amplifier being structured to amplify a differential data signal on the digit lines;

at least one complementary pair of data lines, the data lines being coupled respectively to a selected one of the pairs of digit lines to receive the differential data signal from the selected digit lines;

a DC sense amplifier having a complementary pair of inputs, a first output, and a second output coupled to a capacitor, each of the pair of inputs of the DC sense amplifier being coupled to a respective one of the data lines to receive the differential data signal from the data lines, the DC sense amplifier being structured to generate an amplified differential signal from the first and second outputs based on the differential data signal received from the data lines; and a data output circuit having an input coupled to the first output of the DC sense amplifier by a single conductive path to receive the amplified signal and a data output terminal, the data output circuit being structured to provide a data signal to the data output terminal based on the amplified signal.

5. A computer system comprising:

a processor having a processor bus;

an input device coupled to the processor through the processor bus and adapted to allow data to be entered into the computer system;

an output device coupled to the processor through the processor bus and adapted to allow data to be output from the computer system; and a memory device coupled to the processor through the processor bus, the memory device comprising:

at least one array of memory cells arranged in rows and columns, each of the rows having a row line and each of the columns having a complementary pair of digit lines;

a sense amplifier for each column, each sense amplifier having a pair of terminals coupled respectively to the digit lines of a respective one of the columns, the sense amplifier being structured to amplify a differential data signal on the digit lines;

at least one complementary pair of data lines, the data lines being coupled respectively to a selected one of the pairs of digit lines to receive the differential data signal from the selected digit lines;

a DC sense amplifier having a complementary pair of inputs and a first output, each of the pair of inputs of the DC sense amplifier being coupled to a respective one of the data lines to receive the differential data signal from the data lines, the DC sense amplifier being structured to generate an amplified signal at the first output based on the differential data signal received from the data lines;

a data output circuit having an input coupled to the first output of the DC sense amplifier by a single conductive path to receive the amplified signal and a data output terminal, the data output circuit being structured to provide a data signal to the data output terminal based on the amplified signal, a multiplexer having an input coupled to the first output of the DC sense amplifier and an output coupled to the input of the data output circuit;

a plurality of complementary pairs of I/O lines;

a row address circuit coupled to the address bus for activating a row line corresponding to a row address coupled to the row address circuit through the address bus; and a column address circuit coupled to the address bus for coupling to a pair of the I/O lines a selected one of the pairs of digit lines for a column corresponding to a column address coupled to the column address circuit through the address bus.

6. A memory device fabricated in a semiconductor substrate comprising:

at least one array of memory cells arranged in rows and columns, each of the columns having a complementary pair of digit lines;

a plurality of DC sense amplifiers, each DC sense amplifier being selectively coupled to a pair of digit lines in a respective group of the columns in the array;

a plurality of output buffer circuits in the semiconductor material located farther from the array than the DC sense amplifiers, each output buffer circuit being selectively coupled through a single data path line to a single output of a DC sense amplifier in a respective group of the DC sense amplifiers, each output buffer circuit having an output terminal structured to provide a data signal to a data bus;

a sense amplifier for each column, each sense amplifier having a pair of terminals coupled respectively to the digit lines of a respective one of the columns, the sense amplifier being structured to amplify a differential data signal on the digit lines;

a plurality of first multiplexers coupled between the sense amplifiers and the DC sense amplifiers, the first multiplexers being structured to couple selected pairs of digit lines to respective DC sense amplifiers according to one or more first control signals; and a plurality of second multiplexers coupled between the DC sense amplifiers and the output buffer circuits, the second multiplexers being structured to couple selected single data path lines from respective DC sense amplifiers to respective output buffer circuits based on one or more second control signals.

* * * * *